US 9,329,499 B2

(12) United States Patent
Bischoff et al.

(10) Patent No.: US 9,329,499 B2
(45) Date of Patent: May 3, 2016

(54) SUPPORT FOR A COMPONENT OF AN OPTICAL DEVICE INCLUDING A LOCKING DEVICE

(75) Inventors: Thomas Bischoff, Aalen (DE); Joachim Feucht, Boebingen (DE); Jochen Wieland, Oberkochen (DE); Stefan Mueller, Bingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 854 days.

(21) Appl. No.: 12/569,262

(22) Filed: Sep. 29, 2009

(65) Prior Publication Data

US 2010/0079737 A1    Apr. 1, 2010

Related U.S. Application Data

(63) Continuation of application No. PCT/EP2007/053126, filed on Mar. 30, 2007.

(51) Int. Cl.
*G03F 7/20*    (2006.01)
*G02B 7/02*    (2006.01)

(52) U.S. Cl.
CPC ............ *G03F 7/70825* (2013.01); *G02B 7/025* (2013.01)

(58) Field of Classification Search
CPC ............................ G03F 7/70825; G02B 7/025
USPC ...................................... 355/67, 53; 359/811
See application file for complete search history.

(56) References Cited

U.S. PATENT DOCUMENTS

| 6,842,277 | B2 | 1/2005 | Watson |
| 6,844,994 | B2 | 1/2005 | Melzer et al. |
| 6,884,994 | B2 | 4/2005 | Simonetti et al. |
| 2003/0234918 | A1 | 12/2003 | Watson |
| 2004/0144915 | A1 | 7/2004 | Wagner et al. |
| 2004/0146336 | A1 | 7/2004 | Maul et al. |
| 2005/0002011 | A1 | 1/2005 | Sudoh |

FOREIGN PATENT DOCUMENTS

| EP | 0 230 277 | 7/1987 |
| WO | WO 2004/001479 | 12/2004 |

*Primary Examiner* — Chia-How Michael Liu
(74) *Attorney, Agent, or Firm* — Fish & Richardson P.C.

(57) ABSTRACT

The disclosure provides an arrangement for an optical device including a component of the optical device and a support structure supporting the component. The support structure includes at least one locking device connected to the component and including a first fixation device and an associated second fixation device. The first fixation device and the second fixation device are adapted to be, in a movable state, movable with respect to each other along a first degree of freedom and a second degree of freedom into a final position. The first fixation device and the second fixation device are further adapted to be, in a locked state, fixed in the final position by at least one locking device contacting the first fixation device and the second fixation device. In the movable state, the first fixation device and the second fixation device are movable, up to the final position, in a manner free from a mutual pre-stress resulting from a restoring force exerted by at least a part of one of the first fixation device and the second fixation device.

16 Claims, 5 Drawing Sheets

SUPPORT FOR A COMPONENT OF AN OPTICAL DEVICE INCLUDING A LOCKING DEVICE

CROSS-REFERENCE TO RELATED APPLICATION

This application is a continuation of, and claims benefit under 35 USC 120 to, international application PCT/EP2007/053126, filed Mar. 30, 2007. International application PCT/EP2007/053126 is hereby incorporated by reference in its entirety.

FIELD

The disclosure relates to arrangements within an optical device that may be used in exposure processes and systems, such as microlithography processes and systems. The disclosure also relates to optical imaging arrangements including such an arrangement. The disclosure further relates to methods of supporting a component of optical device. The disclosure may be used in the context of photolithography processes for fabricating microelectronic devices, such as semiconductor devices, or in the context of fabricating devices, such as masks or reticles, used during such photolithography processes.

BACKGROUND

Typically, optical systems used in the context of fabricating microelectronic devices such as semiconductor devices include a plurality of optical element modules including optical elements, such as lenses, mirrors, gratings etc., in the light path of the optical system. The optical elements usually cooperate in an exposure process to illuminate a pattern formed on a mask, reticle or the like and to transfer an image of this pattern onto a substrate such as a wafer. The optical elements are usually combined in one or more functionally distinct optical element groups that may be held within distinct optical element units.

With such optical systems, the optical element units are often built from a stack of optical element modules holding one or more—typically rotationally symmetric—optical elements. The optical element modules usually include an external generally ring shaped support structure supporting one or more optical element holders each, in turn, holding one or more optical elements.

SUMMARY

In some embodiments, the disclosure provides good and long term reliable imaging properties of an optical device including deformation sensitive components used in an exposure process.

In certain embodiments, the disclosure reduces the effort involved for an optical device used in an exposure process while at least maintaining the imaging accuracy during operation of the optical device.

The disclosure involves the teaching that a reduction of undesired loads on a deformation sensitive component of an optical device and, thus, the effort, in particular the control effort, involved for correcting imaging errors resulting from such undesired loads acting on such deformation sensitive components is possible by providing a support to such a component functionally separating the elements providing the position adjustment of the component and the elements locking the component in its desired position. With this approach, on the one hand, the position of the component may be precisely adjusted via the adjustment elements (under well-defined load conditions with the desired pretension of the adjustment elements) while it is not necessary to provide a pretension of the elements locking the component in its final position. These elements locking the component in its final position may simply follow the adjustment movements of the component without experiencing any frictional effects which would otherwise result from a pretension of such components. Once the component is locked in its position is even possible to reduce or even fully remove the forces applied to the component via the adjustment elements such that residual loads introduced via these adjustment elements are reduced or even fully excluded.

On the other hand, it is possible and beneficial to lock the elements locking the component in its final position in a manner such that their position substantially does not undergo any changes between the state prior to and after the locking operation. With this approach, residual loads resulting from such a position alteration and acting on the deformation sensitive component may be excluded.

In some embodiments, the disclosure provides an arrangement for an optical device including a component of the optical device and a support structure supporting the component. The support structure includes at least one locking device connected to the component and including a first fixation device and an associated second fixation device. The first fixation device and the second fixation device are adapted to be, in a movable state, movable with respect to each other along a first degree of freedom and a second degree of freedom into a final position. The first fixation device and the second fixation device are further adapted to be, in a locked state, fixed in the final position by at least one locking device contacting the first fixation device and the second fixation device. In the movable state, the first fixation device and the second fixation device are movable, up to the final position, in a manner free from a mutual pre-stress resulting from a restoring force exerted by at least a part of one of the first fixation device and the second fixation device.

In certain embodiments, the disclosure provides an arrangement for an optical device including a component of the optical device and a support structure supporting the component. The support structure includes at least one locking device connected to the component and including a first fixation device and an associated second fixation device. The first fixation device and the second fixation device are adapted to be fixed in a final position by at least one locking device contacting the first fixation device and the second fixation device. The locking device is adapted to exert a first locking force and a second locking force between the first fixation device and the second fixation device, the first locking force and the second locking force mutually balancing each other. The locking device is further adapted to produce substantially no alteration in the relative position of the first fixation device and the second fixation device between a state prior to appliance of the first locking force and the second locking force and a state after appliance of the first locking force and the second locking force.

In some embodiments, the disclosure provides an optical imaging arrangement including a mask unit adapted to receive a pattern, a substrate unit adapted to receive a substrate, and an optical projection unit adapted to transfer an image of the pattern onto the substrate. At least one of the mask unit, the substrate unit and the optical projection unit includes a component and a support structure supporting the component. The support structure includes at least one locking device connected to the component and including a first fixation device and an associated second fixation device. The first fixation device and the second fixation device are adapted to be, in a movable state, movable with respect to each other along a first degree of freedom and a second degree of freedom into a final position. The first fixation device and the second fixation device are further adapted to be, in a locked state, fixed in the final position by at least one locking device contacting the first fixation device and the second fixation device. In the movable state, the first fixation device and the second fixation device are movable, up to the final position, in a manner free from a mutual pre-stress resulting from a restoring force exerted by at least a part of one of the first fixation device and the second fixation device.

In certain embodiments, the disclosure provides an optical imaging arrangement including a mask unit adapted to receive a pattern, a substrate unit adapted to receive a substrate, and an optical projection unit adapted to transfer an image of the pattern onto the substrate. At least one of the mask unit, the substrate unit and the optical projection unit includes a component and a support structure supporting the component. The support structure includes at least one locking device connected to the component and including a first fixation device and an associated second fixation device. The first fixation device and the second fixation device are adapted to be fixed in a final position by at least one locking device contacting the first fixation device and the second fixation device. The locking device is adapted to exert a first locking force and a second locking force between the first fixation device and the second fixation device, the first locking force and the second locking force mutually balancing each other. The locking device is adapted to produce substantially no alteration in the relative position of the first fixation device and the second fixation device between a state prior to appliance of the first locking force and the second locking force and a state after appliance of the first locking force and the second locking force.

In some embodiments, the disclosure provides a method of supporting a component of an optical device. The method includes providing the component, at least one first fixation device and at least one associated second fixation device. In a mounting step, the component is connected to one of the first fixation device and the associated second fixation device. In an adjustment step, the position of the component is adjusted thereby moving the first fixation device and the second fixation device with respect to each other along a first degree of freedom and a second degree of freedom into a final position in a manner free from a mutual pre-stress resulting from a restoring force exerted by at least a part of one of the first fixation device and the second fixation device. In a locking step, the first fixation device and the associated second fixation device are locked in the final position to support the component via the first fixation device and the associated second fixation device.

In certain embodiments, the disclosure provides a method of supporting a component of an optical device. The method includes providing the component, at least one first fixation device and at least one associated second fixation device. In a mounting step, the component is connected to one of the first fixation device and the associated second fixation device. In an adjustment step, the position of the component is adjusted thereby moving the first fixation device and the second fixation device with respect to each other into a final position. In a locking step, the first fixation device and the second fixation device are locked in the final position by exerting a first locking force and a second locking force between the first fixation device and the second fixation device, the first locking force and the second locking force mutually balancing each other. The first locking force and the second locking force are applied such that substantially no alteration in the relative position of the first fixation device and the second fixation device between a state prior to appliance of the first locking force and the second locking force and a state after appliance of the first locking force and the second locking force is produced.

In some embodiments, the disclosure provides an arrangement for an optical device including a component of the optical device and a support structure supporting the component. The support structure includes at least one adjustment device and at least one locking device. The at least one adjustment device is adapted to contact the component and to provide position adjustment of the component to a final position of the component. The at least one locking device is adapted to follow the position adjustment of the component in a substantially frictionless manner in a first state and to lock the component in the final position in a second state.

In certain embodiments, the disclosure provides a method of supporting a component of an optical device. The method includes providing the component, at least one adjustment device and at least one locking device. In a mounting step, the component is connected to the at least one adjustment device and the at least one locking device. In an adjustment step, the position of the component up to a final position is adjusted using the at least one adjustment device, the at least one locking device following the position adjustment of the component in a substantially frictionless manner. In a locking step, the at least one locking device is locked to support the component in the final position via the at least one locking device.

Further aspects and embodiments of the disclosure will become apparent from the claims, the following description of exemplary embodiments and the appended figures. All combinations of the features disclosed, whether explicitly recited in the claims or not, are within the scope of the disclosure.

DETAILED DESCRIPTION

In the following, an exemplary embodiment of an optical imaging arrangement 101 will be described with reference to FIGS. 1 to 4.

Figure 1:
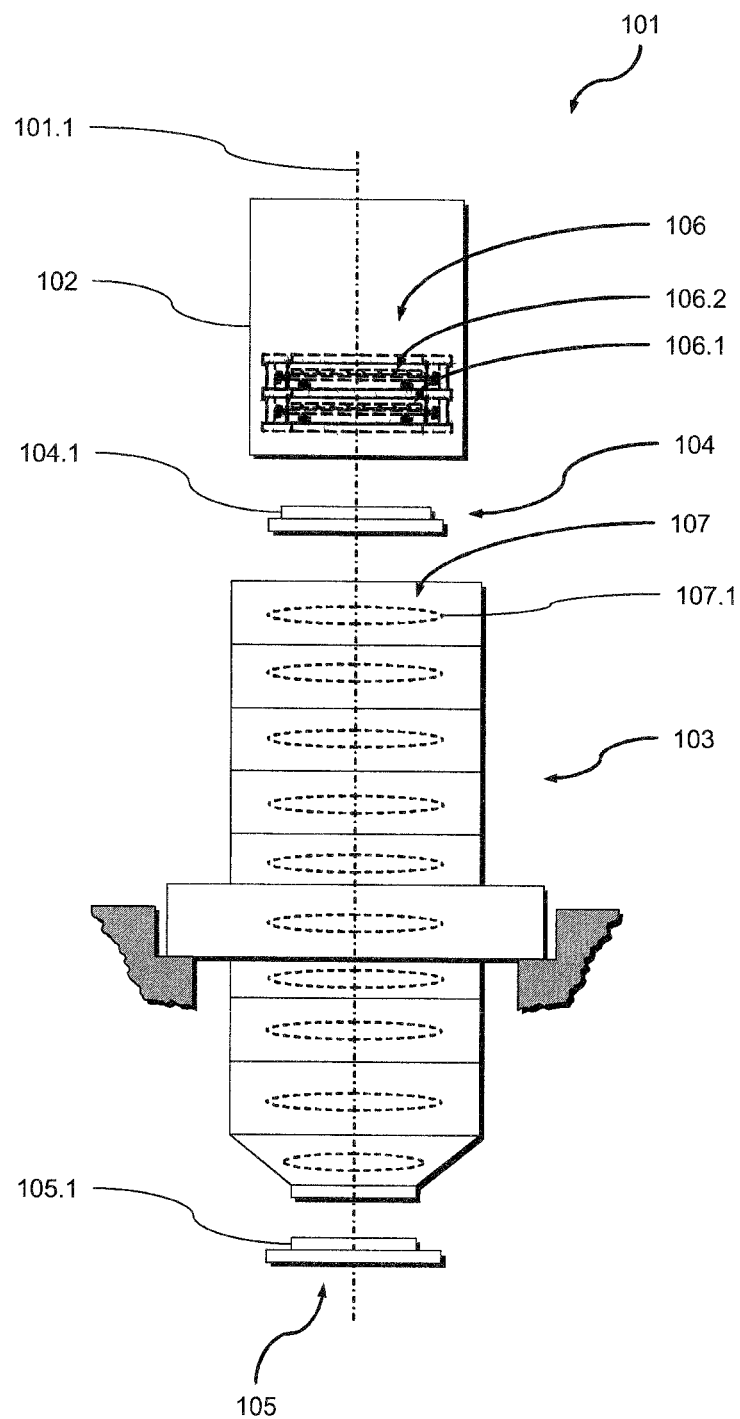
FIG. 1 is a schematic representation of an optical imaging arrangement which includes an arrangement for an optical device and with which exemplary embodiments may be executed.

FIG. 1 is a schematic and not-to-scale representation of the optical imaging arrangement in the form of an optical exposure apparatus 101 used in a microlithography process during manufacture of semiconductor devices. The optical exposure apparatus 101 includes a first optical device in the form of an illumination unit 102 and a second optical device in the form of an optical projection unit 103 adapted to transfer, in an exposure process, an image of a pattern formed on a mask 104.1 of a mask unit 104 onto a substrate 105.1 of a substrate unit 105. To this end, the illumination unit 102 illuminates the mask 104.1. The optical projection unit 103 receives the light coming from the mask 104.1 and projects the image of the pattern formed on the mask 104.1 onto the substrate 105.1, e.g. a wafer or the like.

The illumination unit 102 includes an optical element system 106 including a plurality of optical elements units such as optical element units 106.1, 106.2. The optical projection unit 103 includes a further optical element system 107 including a plurality of optical element units 107.1. The optical element units of the optical element systems 106 and 107 are aligned along an (eventually folded) optical axis 101.2 of the optical exposure apparatus 101 and may include any type of optical element, such as lenses, mirrors, gratings or the like.

The optical element system 106 is held by a stack of optical element modules including an optical element module with the first optical element unit 106.1 and the second optical elements units 106.2. The first optical element unit 106.1 includes a first optical element in the form of a first diffractive element 108 while the second optical element unit 106.2 includes a second optical element in the form of a second diffractive element 109. The respective optical element 108, 109 has an element body 108.1 and 109.1, respectively, with a suitable grating formed thereon.

Figure 2:
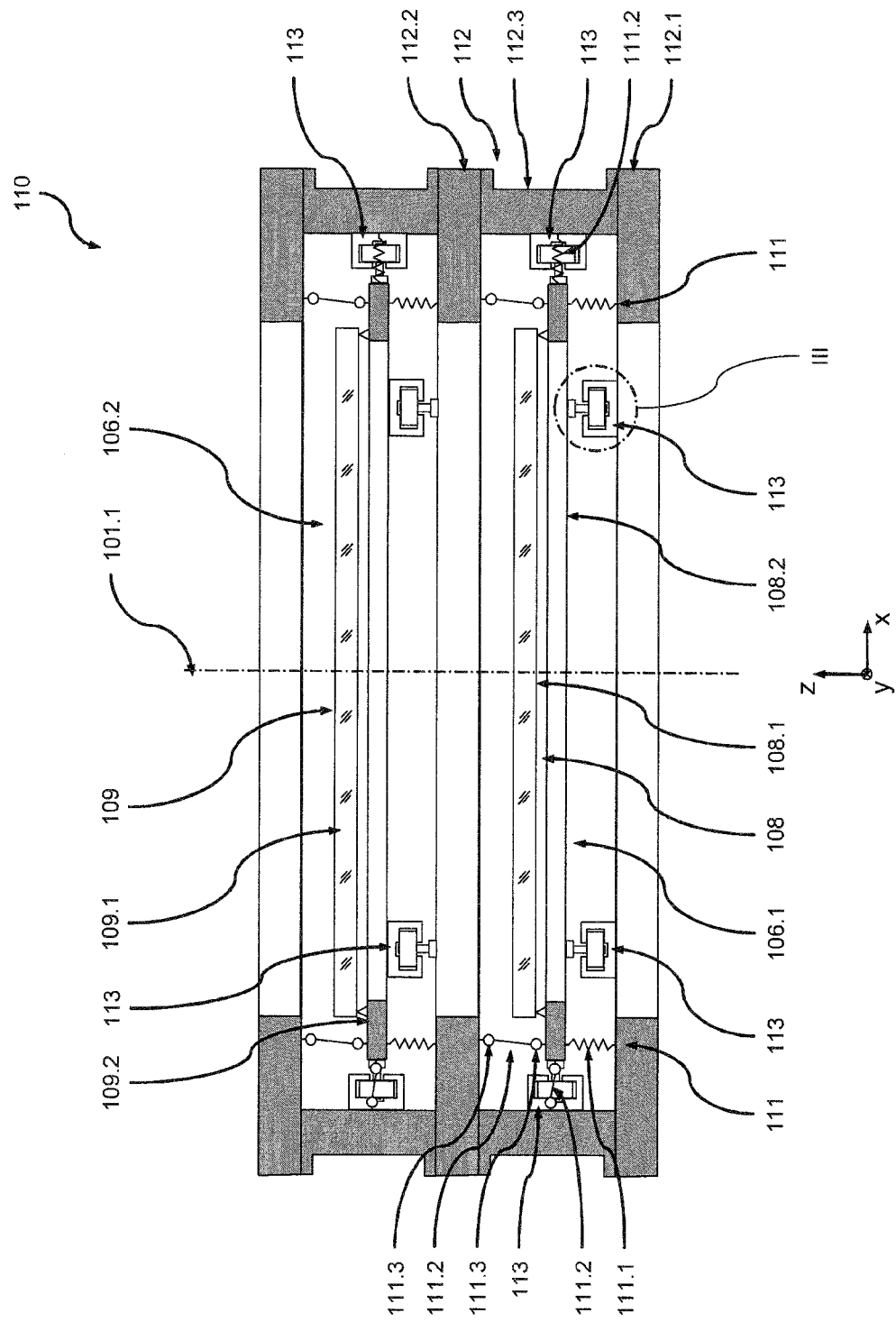
FIG. 2 is a schematic sectional representation of a module being a part of the optical imaging arrangement of FIG. 1.

FIG. 2 shows a schematic and not-to-scale sectional view of the optical element module 110 including the first optical element unit 106.1 and the second optical element unit 106.2. As can be seen from FIG. 2, the first optical element 108 is firmly connected to a generally ring shaped holder 108.2 while the second optical element 109 is firmly connected to a generally ring shaped holder 109.2.

The optical elements of the optical systems 106 and 107 have to be positioned and held in a well defined manner during the exposure process in order to provide a high-quality exposure result. In particular, care has to be taken that the respective optical element does not undergo unwanted deformations which would otherwise alter the optical characteristic of the respective optical element and, thus, introduce an imaging error which would deteriorate the exposure result of the optical exposure apparatus 101.

Due to the mechanical connection between the respective optical element 108, 109 and its holder 108.2, 109.2, deformation introduced into the respective holder 108.2, 109.2 is transferred at least to some extent to the associated optical element 108, 109, respectively. Thus, in other words, each of the optical element units 106.1, 106.2, 107.1 represents a deformation sensitive component of the respective optical element system 106 and 107.

The first optical element unit 106.1 is held by a support structure 110 which in turn is connected to the other components of the illumination unit 102 and supported on a ground structure by a suitable mechanism (not shown in further detail in FIG. 1). For example, the support structure 110 may form a part of the housing of the illumination unit 102.

The support structure 110 includes a plurality of support devices 111 which are adapted to, both, adjust to the position of the optical element unit 106.1 during manufacture as well as to compensate a part of the gravitational force acting on the optical element unit 106.1. The support devices 111 are connected to a frame device 112 including generally ring shaped base elements 112.1, 112.2 arranged in parallel to each other and held spaced along the optical axis 101.1 by a generally ring shaped spacer element 112.3.

The frame device 112 may, for example, form a part of the housing of the illumination unit 102. It may have any suitable shape. Typically, it has a circular shape generally rotationally symmetric with respect to the optical axis 101.1. However, any other polygonal shape, in particular a rectangular shape, may also be appropriate.

Each support device 111 includes a spring-loaded contact device 111.1 as a first support element. The contact device 111.1 is connected to the frame device 112 and contacts a first contact surface of the optical element unit 106.1 with a predetermined contact force as a first support force.

Each support device 111 further includes a flexible support element 111.2 as a second support element. The second support element 111.2 is connected to the frame device 112 and the optical element unit 106.1. The second support element 111.2 is arranged such that it contacts the optical element unit 106.1 on a side opposite to its associated first support element 111.1. Furthermore, the second support element 111.2 is arranged such that it exerts a second support force on the optical element unit 106.1 which is arranged substantially collinear with the first support force but has a direction opposite thereto.

The flexible second support element 111.2 includes a plurality of flexures 111.3 (indicated only in a highly simplified form in FIG. 2) which are arranged such that the second support element 111.2 restricts the motion of the optical element unit 106.1 along one degree of freedom. Such arrangements of flexures providing a restriction of motion along one degree of freedom are well known in the art such that it will not be discussed here in further detail.

The predetermined first support force of the respective contact device 111.1 may be adjusted by a suitable mechanism, e.g. via an adjustment screw, in order to position the optical element unit 106.1. In the exemplary embodiment shown in FIG. 2 there are provided six support devices 111 connected to the optical element unit 106.1 in such a manner that the position of the optical element unit 106.1 may be adjusted in all six degrees of freedom.

More specifically, three support devices 111 (only two of which are visible in FIG. 2) are distributed at the outer circumference of the optical element unit 106.1 in such a manner that it is possible to adjust the translation of the optical element unit 106.1 along the z-axis and the rotation of the optical element unit 106.1 about the x-axis and the y-axis. Furthermore, the other three support devices 111 (only one of which is visible in FIG. 2) are also distributed at the outer circumference of the optical element unit but act in the plane of the holder 108.2 in order to be able to adjust translation of the optical element unit 106.1 along the x-axis and the y-axis and the rotation of the optical element unit 106.1 about the z-axis.

It will be appreciated that, with some exemplary embodiment of the disclosure, any other suitable and desired design a number of support devices may be provided to support and adjust the position of the optical element unit 106.1. Furthermore, depending on the number of support devices provided, any other suitable restriction of motion may be provided by the respective support device. In particular, the respective support device may restrict motion on the optical element unit along more than one degree of freedom. Finally, there may be combined different types of support devices each providing a restriction of motion along a different number of degrees of freedom.

Figure 3A:
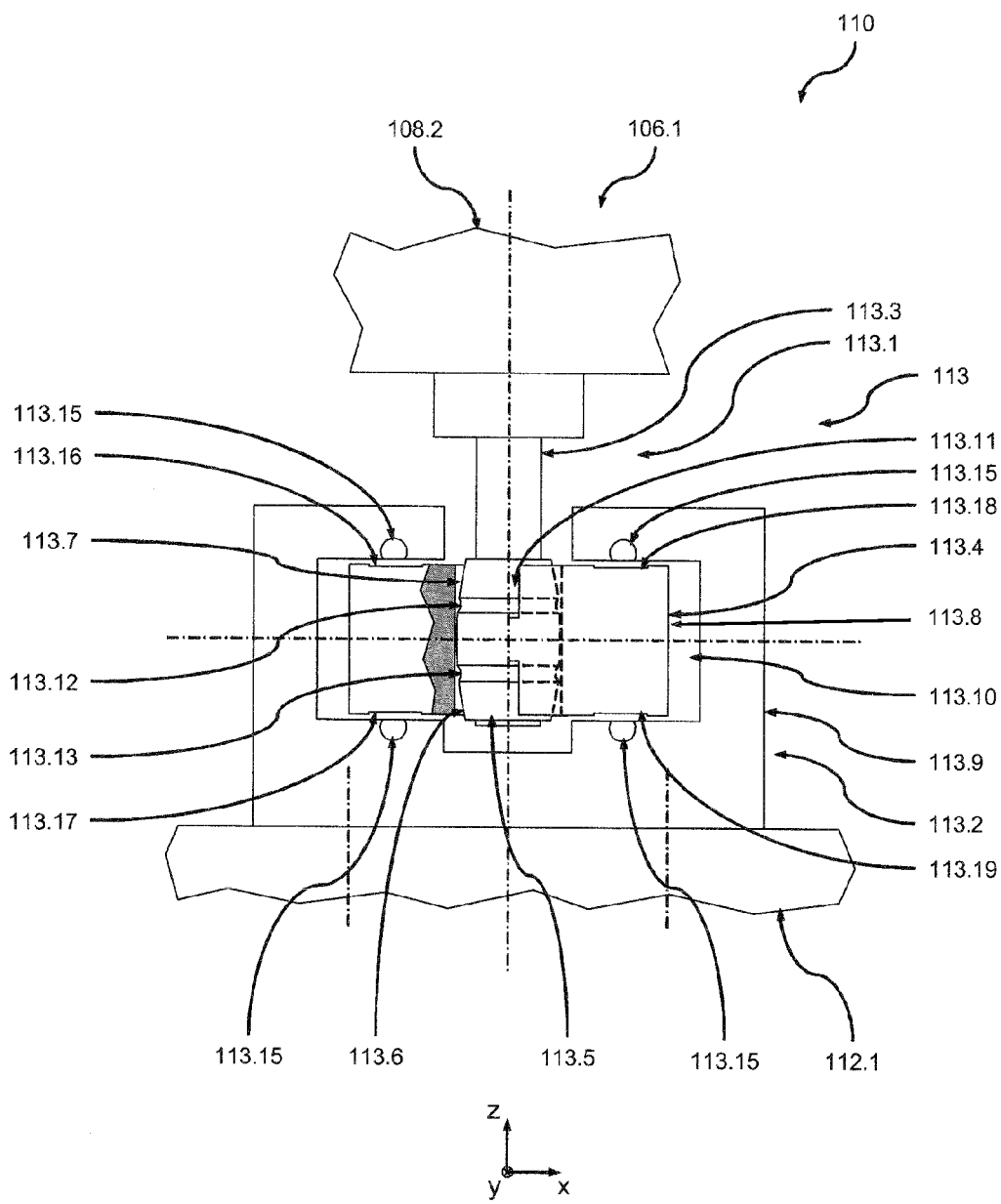
FIG. 3A is a schematic partially sectional view of the detail III of the module of FIG. 2 in a first state.
Figure 3B:
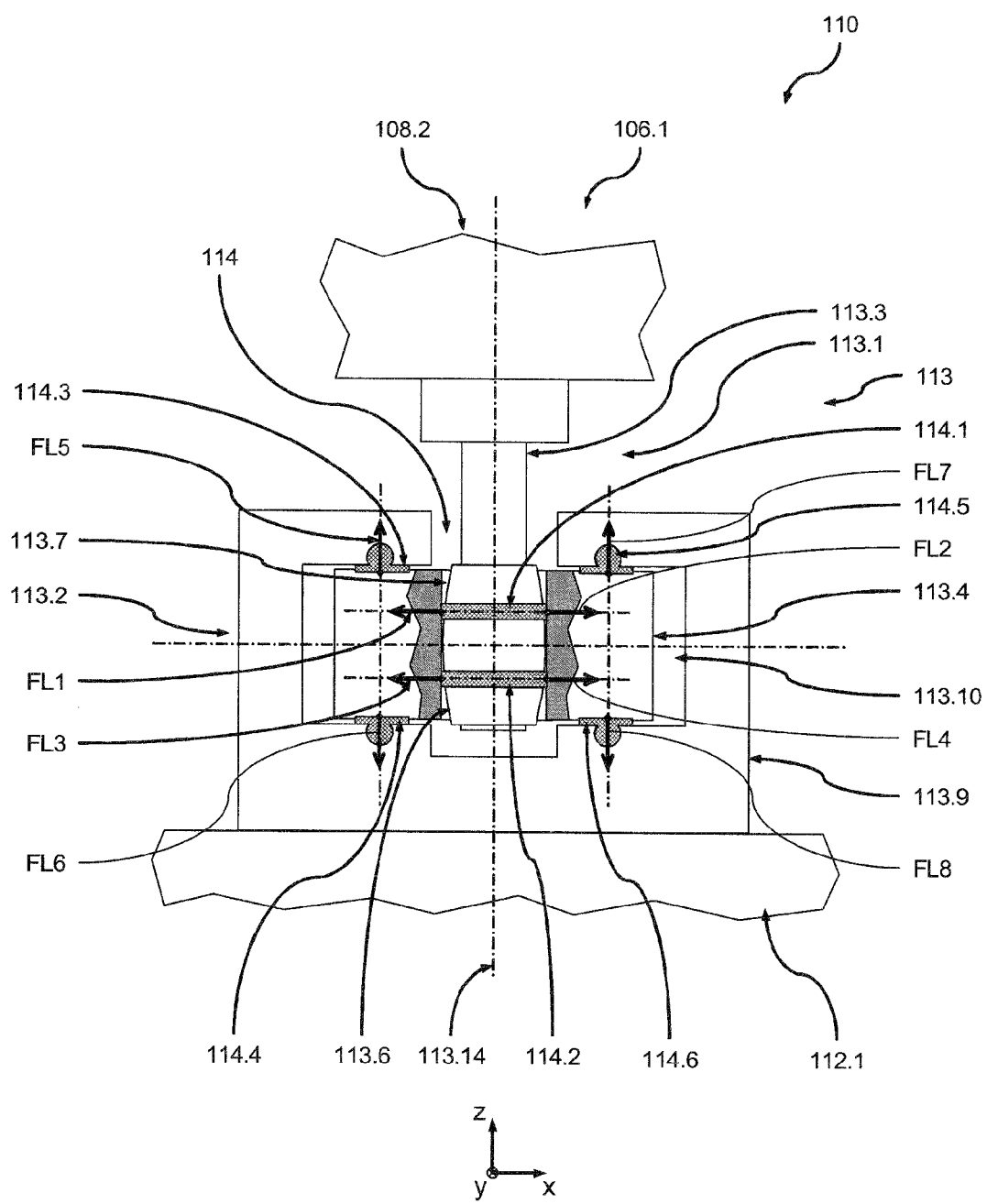
FIG. 3B is a schematic partially sectional view of the detail III of the module of FIG. 2 in a second state.
Figure 4:
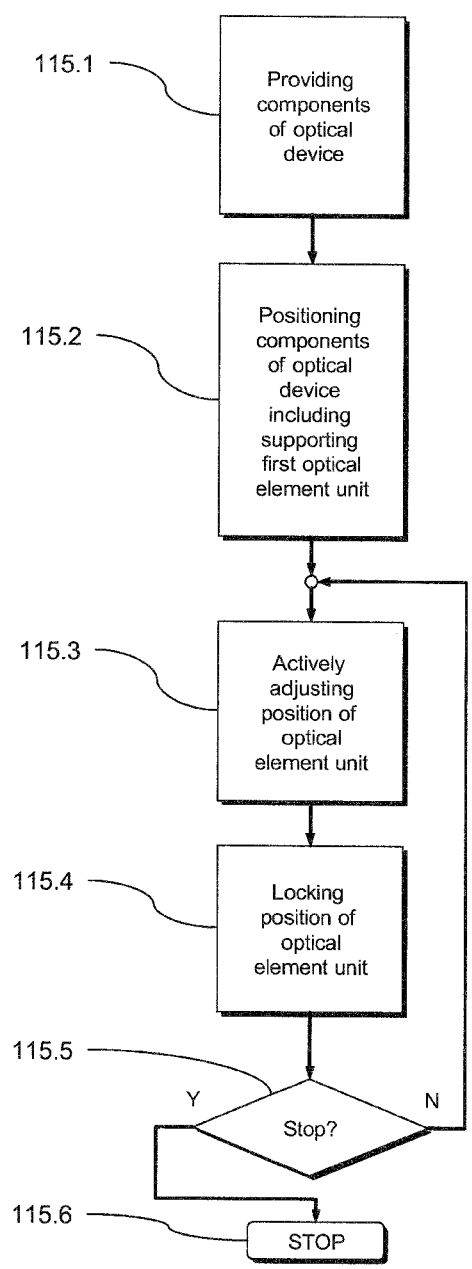
FIG. 4 is a block diagram of a method of supporting an optical element which may be executed with the optical imaging arrangement of FIG. 1.

Once the correct position of the optical element unit 106.1 is adjusted via the support devices 111, this status is "frozen" using a plurality of locking devices 113 as will be now explained in further detail reference to FIGS. 2, 3A and 3B.

FIG. 3A shows the detail III of FIG. 2 in a first state where the respective locking device 113 is still in an unlocked or movable state. As can be seen from FIG. 3, the locking device 113 includes a first fixation device 113.1 connected to the holder 108.2 of the first optical element unit 106.1 and a second fixation device 113.2 connected to the base element 112.1. Either connection of the first and second fixation device 113.1, 113.2 may be a removable connection, e.g. a screw connection or the like, which allows to dismount the arrangement at a later stage for repair of other purposes.

However, it will be appreciated that, with some exemplary embodiments of the disclosure, either one of these connections may be a connection which may only be loosened by at least partial destruction. Finally, it will be appreciated that at least a part of the first fixation device may be monolithically connected to (or integrally formed with) the first optical element unit while at least a part of the second fixation device may be monolithically connected to (or integrally formed with) the frame device.

The first fixation device 113.1 includes an elongated first fixation element 113.3 and a block-shaped second fixation element 113.4. The elongated first fixation element 113.3, at one of its ends, is connected to the holder at 108.2. At its other end, the first fixation element 113.3 has a pin-shaped end section 113.5 with a generally barrel-shaped surface 113.6.

The end section 113.5 of the first fixation element 113.3 engages a first coupling recess in the form of a cylindrical bore 113.7 of the second fixation element 113.4. The maximum diameter of the barrel-shaped surface 113.6 and the diameter of the cylindrical first coupling recess are adapted to provide a slight play between the first fixation element 113.3 and the second fixation element 113.4. Thus, in the first state shown in FIG. 3A, due to the barrel-shaped surface 113.6 and it's play with respect to the cylindrical wall of the bore 113.7, upon a corresponding adjustment movement provided via the support devices 111, substantially unrestricted relative motion between the first fixation element 113.3 and the second fixation element 113.4 is possible along four degrees of freedom, namely rotation about the x-, y- and z-axis and translation along the z-axis.

The block-shaped second fixation element 113.4 has a generally prismatic surface, namely a cuboid surface 113.8. The second fixation element 113.4 is received in a corresponding second coupling recess 113.10 that is formed within a block-shaped third fixation element 113.9 (itself forming the second fixation device 113.2).

The surface 113.8 of the second fixation element 113.4 and the surface 113.11 of the third fixation element 113.9 forming the second coupling recess 113.10 are adapted to provide a slight play between the second fixation element 113.4 and the third fixation element 113.9. Thus, in the first state shown in FIG. 3A, due to this play, upon a corresponding adjustment movement provided via the support devices 111, substantially unrestricted relative motion between the second fixation element 113.4 and the third fixation element 113.9 is possible along two degrees of freedom, namely translation along the x- and y-axis.

It is to be noted that, in FIGS. 3A and 3B, the play between the second fixation element 113.4 and the third fixation element 113.9 is exaggerated for reasons of better visibility. Furthermore, for the same reasons, the second fixation element 113.4 is shown in unnaturally lifted position (considering that gravity acts along the z-axis) such that its lower surface does not contact the associated surface of the third fixation element 113.9.

In reality, this lower surface would of course sit on the associated surface of the third fixation element 113.9.

The second coupling recess 113.10 is generally T-shaped such that the first fixation element 113.3, when engaging the second fixation element 113.4 received within the second coupling recess 113.10, may freely move over a certain given a range along the x- and y-axis.

Thus, in summary, in the movable or unlocked state of the locking device 113 (shown in FIG. 3A), substantially unrestricted relative motion between the first fixation element 113.3 and the third fixation element 113.9 is possible in all six degrees of freedom. Thus, the optical element unit 106.1 (within a certain range provided, among others, by the locking devices 113) may be freely adjusted and until it has reached a desired final position. As a consequence, during the adjustment of the position of the optical element unit 106.1, no parasitic loads (forces and/or moments) are introduced into the optical element unit 106.1 via the fixation device 113 which might otherwise lead to unwanted deformations of the optical element 108.

It will be appreciated that, other than with known devices, this substantially unrestricted relative motion is free from any mutual pre-stress between the components of the locking device 113 which, in the devices known in the art, typically result from restoring forces (such as elastic restoring forces resulting from an elastic deformation) exerted by at least one of the parts of devices used for locking the position of a component to be held by a support structure.

Depending on the spatial orientation of the locking device, the only force that counteracts the relative motion between the parts of the locking device 113 is a frictional force FR acting during this relative motion. This frictional force FR is due to the gravitational force G acting on the second fixation element 113.4. It may be roughly calculated as:

$$FR = \mu \cdot G, \quad (1)$$

wherein $\mu$ is the coefficient of friction prevailing at the contact surface between the parts where the relative motion occurs. Since the mass of the second fixation element 113.4 and, thus, the gravitational force G may be kept very low, this frictional force FR is negligible. Furthermore, if need be, the frictional force FR may be reduced by adjusting the coefficient of friction $\mu$, e.g. by a corresponding surface treatment etc. of the contact surfaces. In other words, the locking device 113 may follow the adjustments provided via the support devices 111 in a substantially frictionless manner.

It will be appreciated that, with certain exemplary embodiments of the disclosure, depending on the adjustment motions to be provided for the optical element unit, the respective fixation device may provide a different number of degrees of freedom where such substantially unrestricted relative motion is possible between its components. Furthermore, it will be appreciated that the shape of the fixation elements and the corresponding coupling recesses may be different, in particular dependent on the number and type of unrestricted relative motions to be provided.

Finally, it will be appreciated that, with some exemplary embodiments of the disclosure, the locking device may have a different number of fixation elements which, again, may depend on the number and type of unrestricted relative motions to be provided. In the most simple case, two fixation elements may be sufficient. For example, in a modification of the exemplary embodiment shown in FIG. 3A, the first and second fixation element may be rigidly connected such that only an unrestricted relative translation along the x- and y-axis and a rotation about the z-axis is possible in a case where only position adjustments along these three degrees of freedom are desired.

With the exemplary embodiment shown translational position adjustments in the x-, y- and z-range of up to 500 μm, even up to 1 mm may be easily achieved, while rotational position adjustments about the x- and y-axis of up to 1°, even up to 2°, and about the z-axis of up to 360° may be easily achieved.

FIG. 3B shows the detail III of FIG. 2 in a second state where the optical element unit 106.1 is located in its desired final spatial position and the respective locking device 113 is in a second, locked state. In this locked state no relative motion is possible anymore between the fixation elements 113.3, 113.4 and 113.9 of the locking device 113.

To achieve this locked state, a locking device 114 is provided between the fixation elements 113.3, 113.4 and 113.9 of the locking device 113. In the exemplary embodiment shown, the locking device 114 is an adhesive applied to certain parts of the locking device as will be explained now in further detail.

The first fixation element 113.3 and the second fixation element 113.4 are locked with respect to each other by a first amount 114.1 of adhesive and a second amount 114.2 of adhesive applied via first openings 113.11 within the second fixation element 113.4 (see FIG. 3A) to the interface between the first fixation element 113.3 and the second fixation element 113.4.

More specifically, the first amount 114.1 of adhesive is supplied to a first locking recess in the form of a first circumferential groove 113.12 provided within the circumference of the barrel-shaped section 113.5 of the first fixation element 113.3. The centerline of the first groove 113.12 lies in a plane that is perpendicular to the longitudinal axis 113.14 of the first fixation element 113.3.

The second amount of adhesive is supplied to a second locking recess in the form of a second circumferential groove 113.13 provided at an axial distance from the first locking recess 113.12 within the circumference of the barrel-shaped section 113.5 of the first fixation element 113.3. The centerline of the second groove 113.13 also lies in a plane that is perpendicular to the longitudinal axis 113.14 of the first fixation element 113.3.

The grooves 113.12, 113.13 are designed such that, once supplied to the respective groove 113.12, 113.13, the adhesive is drawn into the respective groove by capillary action such that a substantially even distribution of the adhesive is achieved within the respective groove 113.12, 113.13.

While the adhesive cures within the respective groove 113.12, 113.13, shrinkage of the adhesive occurs which results (in the sectional plane of FIG. 3B) in radial first and second locking forces FL1 and FL2 as well as FL3 and FL4 acting on opposite sides between the first fixation element 113.3 and the second fixation element 113.4.

However, due to the substantially even distribution of the adhesive at the circumference of the respective groove 113.12, 113.13 and due to the arrangement of the grooves 113.12, 113.13, at any time during curing of the adhesive, the first locking force FL1 balances the collinear second locking force FL2 in the region of the first groove 113.12 as well as the first locking force FL3 balances the collinear second locking force FL4 in the region of the second groove 113.13.

Thus, there is no alteration in the relative position between the first fixation element 113.3 and the second fixation element 113.4 between the state prior to the supply of the adhesive (i.e. appliance of the locking forces) and the state after curing of the adhesive (i.e. full build-up of the locking forces).

The second fixation element 113.4 and the third fixation element 113.9 are locked with respect to each other by a third amount 114.3 of adhesive, a fourth amount 114.4 of adhesive, a fifth amount 114.5 of adhesive and a sixth amount 114.6 of adhesive applied via second openings 113.15 within the third fixation element 113.9 (see FIG. 3A) to the interface between the second fixation element 113.4 and the third fixation element 113.9.

More specifically, the third amount 114.3 of adhesive is supplied to a third locking recess in the form of a first transverse groove 113.16 provided within the surface 113.8 of the second fixation element 113.4. The centerline of the first transverse groove 113.16 extends substantially parallel to the yz-plane. Similarly, the fourth amount 114.4 of adhesive is supplied to a fourth locking recess in the form of a second transverse groove 113.17 provided within the surface 113.8 of the second fixation element 113.4 and lying opposite to the first transverse groove 113.16. The centerline of the second transverse groove 113.17 also extends substantially parallel to the yz-plane.

Furthermore, the fifth amount 114.5 of adhesive is supplied to a fifth locking recess in the form of a third transverse groove 113.18 provided within the surface 113.8 of the second fixation element 113.4. The centerline of the third transverse groove 113.19 extends substantially parallel to the yz-plane. Similarly, the sixth amount 114.6 of adhesive is supplied to a sixth locking recess in the form of a fourth transverse groove 113.19 provided within the surface 113.8 of the second fixation element 113.4 and lying opposite to the third transverse groove 113.18. The centerline of the fourth transverse groove 113.19 also extends substantially parallel to the yz-plane.

The transverse grooves 113.16 to 113.19 all have the same dimensions and are designed such that, once supplied to the respective groove 113.16 to 113.19, the adhesive is drawn into the respective groove by capillary action such that a substantially even distribution of the adhesive is achieved within the respective groove 113.16 to 113.19.

While the adhesive cures within the respective groove 113.16 to 113.19, shrinkage of the adhesive occurs which results (in the sectional plane of FIG. 3B) in axial first and second locking forces FL5 and FL6 as well as FL7 and FL8 acting on opposite sides between the second fixation element 113.4 and the third fixation element 113.9.

However, due to the substantially even distribution of the adhesive within the respective groove 113.16 to 113.19 and due to the arrangement of the grooves 113.16 to 113.19, at any time during curing of the adhesive, the first locking force FL5 balances the collinear second locking force FL6 in the region plane of the first and second transverse groove 113.16, 113.17 as well as the first locking force FL7 balances the collinear second locking force FL8 in the plane of the third and fourth transverse groove 113.18, 113.19.

Thus, there is also no alteration in the relative position between the second fixation element 113.4 and the third fixation element 113.9 between the state prior to the supply of the adhesive (i.e. appliance of the locking forces) and the state after curing of the adhesive (i.e. full build-up of the locking forces).

Thus, in summary, during the adjustment of the position of the optical element unit 106.1 as well as during and after the locking of the position of the optical element unit 106.1, no parasitic loads (forces and/or moments) are introduced into the optical element unit 106.1 via the fixation device 113 which might otherwise lead to unwanted deformations of the optical element 108.

It will be appreciated that any of the locking forces may be applied by any other suitable mechanism such as any other adhesive bonding technique (e.g. soldering, welding etc.), any other frictional bonding technique (e.g. clamping) and arbitrary combinations thereof. It will be further appreciated that during appliance or build up of the locking forces a temporary position alteration between the first and second fixation element may be acceptable as long as substantially no position alteration prevails in the final state with full build-up of the locking forces.

It will be further appreciated that, with certain exemplary embodiments of the disclosure, different types and/or amounts of adhesive may be applied to the respective grooves. However, shrinkage and/or the amounts of adhesive have to be adapted to each other such that no alteration in the relative position between the respective fixation elements occurs between the state prior to the supply of the adhesive (i.e. appliance of the locking forces) and the state after curing of the adhesive (i.e. full build-up of the locking forces).

Providing locking recesses in at least two spaced planes has the advantage that a good support against moments (e.g. about the x- and y-axis) is provided. However, it will be appreciated that, with some exemplary embodiments of the disclosure, any other desired number of locking recesses in different planes may be chosen.

The locking devices 113 lock the first optical element unit 106.1 in its final position. There may be provided any suitable number of locking devices 113 to lock the first optical element unit 106.1. Optionally, depending on the space available, a large number of locking devices 113 is provided to achieve even support of forces acting on the first optical element unit 106.1. In the exemplary embodiment shown, eight locking devices 113 are provided at the outer circumference of the first optical element unit 106.1 and connected to the spacer element 112.3 while four locking devices 113 support the first optical element unit 106.1 from below.

In the exemplary embodiment shown, the locking devices 113 primarily serve to balance dynamic forces acting on the first optical element unit 106.1 while the gravitational force acting on the first optical element unit is taken by the support devices 111. Typically, with the exemplary embodiment shown, accelerations of up to 30 g may be taken by the locking devices 113 at maximum position alterations of less than 100 nm.

However, it will be appreciated that, with some exemplary embodiments of the disclosure, such support devices 111 may be omitted or removed at least in part after adjustment and locking of the position of the optical element unit such that substantially all the static and dynamic loads acting on the optical element unit are taken by the locking devices. For example, only the spring loaded contact devices 111.1 may be removed after the locking devices 113 have been locked such that substantially no residual forces resulting from the adjustment process and introduced via the support devices 111 are acting on the optical element unit 106.1 in its locked state anymore.

It will also be appreciated from the foregoing that elements 113.4 and 113.9 can move relative to each other via translation along the z-axis and also via rotation about the x-axis, the y-axis and the z-axis.

The second optical element unit 106.2 is supported and adjusted in a similar manner to the first optical element unit 106.1. The only difference lies within the fact that some of the locking devices are mounted the other way around, i.e. the second locking device 113.2 is mounted to the optical element unit 106.2.

It will be appreciated that a least a part of the other optical elements of the optical system 106 and/or of the optical element unit 107.1 of the optical system 107 may be adjusted and locked in a similar way as it has been described above with respect to the first optical element unit 106.1. Thus, it is here only referred to the explanations given above.

With the optical exposure apparatus 101 of FIG. 1 an exemplary embodiment of a method of supporting an optical element may be executed as it will be described in the following with reference to FIGS. 1 to 4.

In a step 115.1, the components of the optical element module 108 as they have been described above are provided. Eventually, part or all the other components of the illumination unit 102 and part or all the components of the optical projection unit 103 are provided.

In a step 115.2, the components of the optical element module 108 are put into a spatial relation to provide the configuration as it has been described in the context of FIGS. 1 to 3B. Eventually, the same applies to part or all the other components of the illumination unit 102 and part or all the components of the optical projection unit 103.

In a step 115.3, the position of the first optical element unit 106.1 is actively adjusted up to its desired final position via the support devices 111 as it has been described above. Eventually, the same applies to part or all the other components of the illumination unit 102 and part or all the components of the optical projection unit 103.

In a step 115.4, the first optical element unit 106.1 is locked in its final position via the locking devices 113 as it has been described above. Eventually, the same applies to part or all the other components of the illumination unit 102 and part or all the components of the optical projection unit 103.

In a step 115.5 it is determined if the processes to be stopped. If this is not the case, e.g. if a further component of the illumination unit 102 or of the optical projection unit 103 is to be provided and adjusted, the method jumps back to step 115.3. Otherwise the process stops in a step 115.6.

In the foregoing, the disclosure has been described in the context of exemplary embodiments where optical element units including an optical element and a holder holding the optical element have been used. However, it will be appreciated that the disclosure may also be applied to embodiments where the optical element unit exclusively includes an optical element, i.e. where the locking device is directly connected to the optical element. In these cases the disclosure may be extremely beneficial since, in these cases, no holder is available to reduce and compensate a part of the deformation introduced via the support structure.

Although, in the foregoing, the disclosure has been described solely in the context of microlithography systems. However, it will be appreciated that the disclosure may also be used in the context of any other optical device, in particular any other optical device using deformation sensitive components.

What is claimed is:

1. An arrangement, comprising:
   a component of an optical device;
   a support structure supporting the component; and
   at least one locking device connected to the component and the support structure, the at least one locking device comprising an elongated first fixation element, a block-shaped second fixation element, and a block-shaped third fixation element,
   wherein:
   the first fixation element protrudes into a first recess of the second fixation element;
   the second fixation element is received in a second recess of the third fixation element;
   the first fixation element, the second fixation element and the third fixation element are adapted to be, in a movable state, movable with respect to each other along a first degree of freedom and a second degree of freedom into a final position;

the first fixation element, the second fixation element and the third fixation element are adapted to be, in a locked state, fixed in the final position by at least one locking member; and in the movable state, the first fixation element is fixedly connected to a first member selected from the member group consisting of the component and the support structure and the third fixation element is fixedly connected to a second member selected from the member group, the second member being different from the first member.

2. The arrangement according to claim 1, wherein, in the movable state, the first, and the second and third fixation elements are movable, up to the final position, in a manner free from a mutual pre-stress resulting from an elastic deformation of at least a part of the first, second and third fixation elements.

3. The arrangement according to claim 1, wherein the first second and third fixation elements, in the movable state, are movable with respect to each other along at least one further degree of freedom into the final position.

4. The arrangement according to claim 1, wherein the first degree of freedom and the second degree of freedom are of the same type of degree of freedom.

5. The arrangement according to claim 1, wherein the first fixation element comprises a pin-shaped section, and the first recess of the second fixation element receives the pin-shaped section so as to allow relative movement between the first fixation element and the second fixation element along the first degree of freedom.

6. The arrangement according to claim 1, wherein:

at least one locking member is provided to exert a first locking force on a first location on the first fixation element and a second locking force on a second location on the first fixation element;

each of the first and second locations is adjacent to the second fixation element;

the first locking force and the second locking force mutually balance each other; and the at least one locking member is adapted to produce substantially no alteration in a relative position of the first fixation element and the second fixation element between a state prior to appliance of the first locking force and the second locking force and a state after appliance of the first locking force and the second locking force.

7. The arrangement according to claim 6, wherein:

the first locking force is exerted by a first amount of an adhesive; and the second locking force is exerted by a second amount of the adhesive; and at least one of:

the first and second amounts of adhesive are adapted to produce substantially no alteration in the relative position of the first fixation element and the second fixation element between the state prior to appliance of the first locking force and the second locking force and the state after appliance of the first locking force and the second locking force; and shrinkage of the first and second amounts of adhesive is adapted to produce substantially no alteration in the relative position of the first fixation element and the second fixation element between the state prior to appliance of the first locking force and the second locking force and the state after appliance of the first locking force and the second locking force.

8. The arrangement according to claim 6, wherein:

the first locking force and the second locking force act on opposite sides of the first fixation element; and the first locking force and the second locking force are substantially collinear and are substantially the same size but opposite directions.

9. The arrangement according to claim 6, wherein:

the pin-shaped section has a defined first locking recess and a defined second locking recess, or the first recess has a defined first locking recess and a defined second locking recess;

the first locking recess and the second locking recess are located on opposite sides of the first fixation element; and the first locking recess and the second locking recess are adapted to receive a defined amount of an adhesive.

10. The arrangement according to claim 9, wherein the first locking recess and the second locking recess are adapted to draw in the defined amount of adhesive by capillary action.

11. The arrangement according to claim 6, wherein:

the at least one locking member is adapted to exert a third locking force on a third location on the third fixation element along a second direction and to exert a fourth locking force on a fourth location on the third fixation element along the second direction;

the second direction is perpendicular to the first direction;

each of the third and fourth locations is adjacent to the second fixation element;

the third locking force and the fourth locking force mutually balance each other along the second direction; and the at least one locking member is adapted to produce substantially no alteration in the relative position of the second fixation element and the third fixation element along the second direction between a state prior to appliance of the third locking force and the fourth locking force and a state after appliance of the third locking force and the fourth locking force.

12. The arrangement according to claim 1, wherein the second fixation recess allows relative movement between the second fixation element and the third fixation element along the second degree of freedom.

13. An optical imaging arrangement, comprising:

an illumination system adapted to illuminate a pattern of an object;

a mask unit adapted to receive the object having the pattern;

a substrate unit adapted to receive a substrate; and an optical projection unit adapted to transfer an image of the pattern of the object onto the substrate, wherein a member comprises the arrangement of claim 1, and the member is selected from the group consisting of the illumination system, the mask unit, the substrate unit and the optical projection unit.

14. The arrangement according to claim 1, wherein the first fixation element comprises a pin-shaped section received within the first recess of the second fixation element.

15. The arrangement according to claim 14, wherein the pin-shaped section has one of a cylindrical surface and a barrel-shaped surface.

16. The arrangement according to claim 1, wherein the second fixation element is a monolithic element.

* * * * *

UNITED STATES PATENT AND TRADEMARK OFFICE
CERTIFICATE OF CORRECTION

PATENT NO. : 9,329,499 B2
APPLICATION NO. : 12/569262
DATED : May 3, 2016
INVENTOR(S) : Thomas Bischoff et al.

Page 1 of 1

It is certified that error appears in the above-identified patent and that said Letters Patent is hereby corrected as shown below:

In the claims,

Col. 13, line 18, Claim 3, delete "first" and insert -- first, --.

Signed and Sealed this
Twenty-sixth Day of July, 2016

Michelle K. Lee
*Director of the United States Patent and Trademark Office*